United States Patent
Forigo et al.

(10) Patent No.: US 6,903,701 B2
(45) Date of Patent: Jun. 7, 2005

(54) METHOD FOR EVALUATING ELECTRICAL FIELD LEVELS IN THE NEAR-ZONE OF TRANSMITTING ANTENNAS

(75) Inventors: Davide Forigo, Turin (IT); Paolo Gianola, Turin (IT); Renato Scotti, Turin (IT); Roberto Vallauri, Turin (IT)

(73) Assignee: Telecom Italia S.p.A., Milan (IT)

( * ) Notice: Subject to any disclaimer, the term of this patent is extended or adjusted under 35 U.S.C. 154(b) by 21 days.

(21) Appl. No.: 10/478,881

(22) PCT Filed: May 23, 2002

(86) PCT No.: PCT/EP02/05657

§ 371 (c)(1),
(2), (4) Date: Nov. 21, 2003

(87) PCT Pub. No.: WO02/095428

PCT Pub. Date: Nov. 28, 2002

(65) Prior Publication Data

US 2004/0157594 A1 Aug. 12, 2004

(30) Foreign Application Priority Data

May 23, 2001 (IT) ..................................... TO2001A0475

(51) Int. Cl.⁷ .............................. H04Q 7/20; H04Q 7/00
(52) U.S. Cl. ................... 343/787; 455/422.1; 455/33.1; 455/69; 455/56.1; 455/52.1

(58) Field of Search ........................ 343/787; 455/422.1, 455/67.1, 13.4, 33.1, 56.1, 69, 525, 422, 432, 440

(56) References Cited

U.S. PATENT DOCUMENTS

| | | | | | |
|---|---|---|---|---|---|
| 5,386,588 | A | * | 1/1995 | Yasuda | 455/423 |
| 5,951,709 | A | * | 9/1999 | Tanaka | 714/755 |
| 6,630,831 | B2 | * | 10/2003 | Amini | 324/339 |
| 6,813,508 | B1 | * | 11/2004 | Shioda et al. | 455/525 |
| 2002/0081978 | A1 | * | 6/2002 | Hou et al. | 455/67.1 |

OTHER PUBLICATIONS

Measurement of the Antenna Factor of Diverse Antennas . . . by James McLean et al. (IEEE 1999).

* cited by examiner

Primary Examiner—Thuy Vinh Tran
Assistant Examiner—Chuc Tran
(74) Attorney, Agent, or Firm—Herbert Dubno

(57) ABSTRACT

The method for evaluating electrical field levels in the near-zone of transmitting antennas, particularly linear array antenna widely used in cellular telephony systems, provides accurate evaluation while requiring reduced processing times and a restricted set of input data, such as physical external dimensions of the antenna, its gain and its radiation patterns in the vertical plane and in the horizontal plane.

4 Claims, 2 Drawing Sheets

Figure 1:
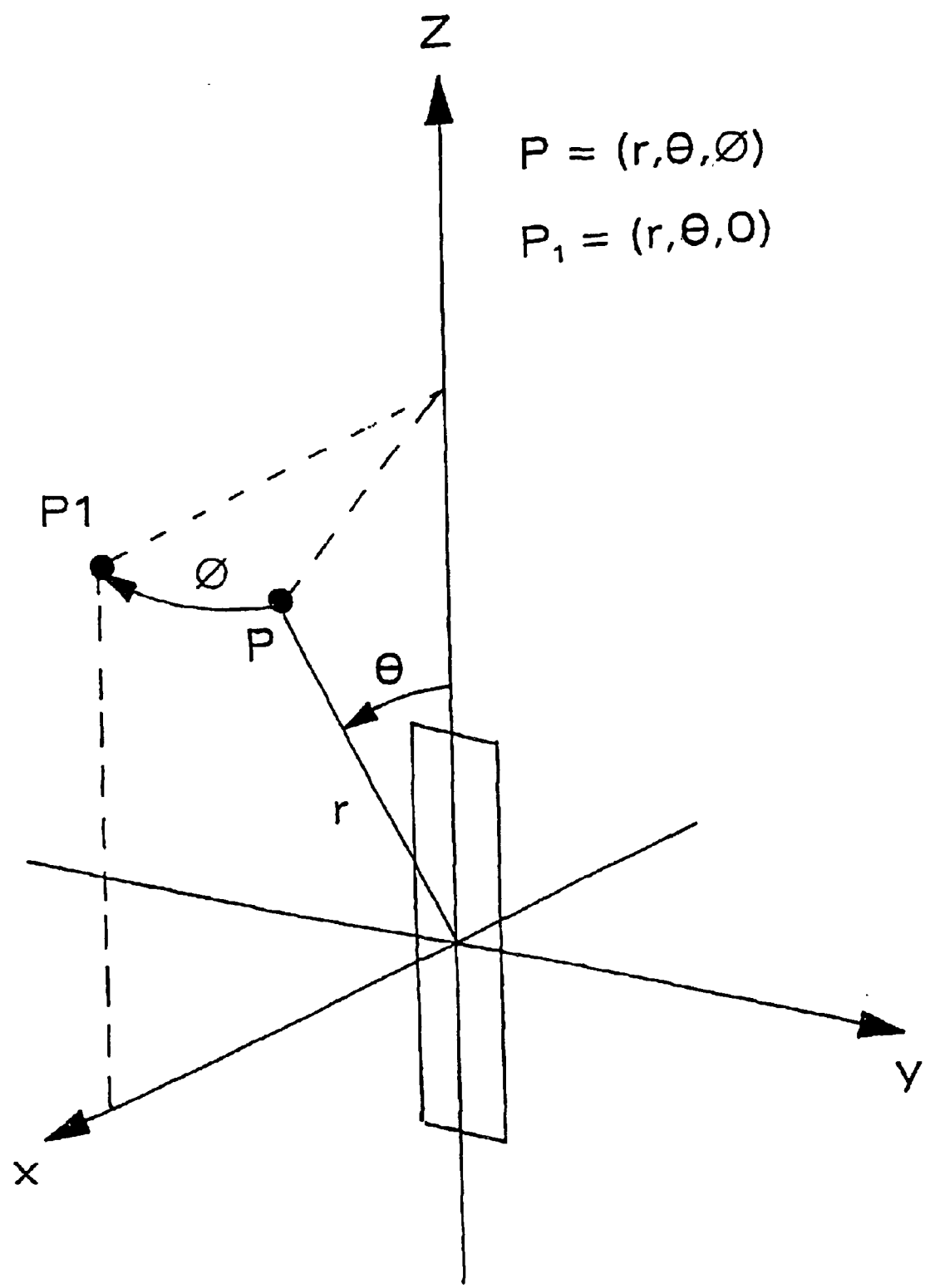

METHOD FOR EVALUATING ELECTRICAL FIELD LEVELS IN THE NEAR-ZONE OF TRANSMITTING ANTENNAS

DESCRIPTION

This invention relates to tools for planning radio carrier telecommunications systems and particularly relates to a method for evaluating electrical field levels in near-zones of transmitting antennas.

The increase of radio base stations (RBSs) for mobile communications in highly populated areas has caused growing anxiety in people living close to said stations, worried about biological effects from electromagnetic pollution on the human body. As a consequence, governments in various countries have established stringent exposure limits for the level of electromagnetic fields radiated in the radio-frequency range, in zones where the population may be exposed for long periods of time. Mobile telephony operators must produce more detailed documentation on the compliance of their radio base stations to prescribed limits. Consequently, the use of more accurate and reliable planning tools is necessary to avoid costly and difficult interventions on devices and systems after construction and installation.

The electrical field radiated by transmitting antennas, particularly radio base station linear arrange antennas, is currently calculated under a far field hypothesis, expressing an antenna gain in spherical co-ordinates $G(\theta,\phi)$ as the product of radiation patterns in the horizontal and vertical planes.

The far field hypothesis is verified when the distance from the antenna exceeds $$\frac{2L_0^2}{\lambda},$$

where $L_0$ is the maximum extension of the antenna and $\lambda$ is the wavelength. Considering base radio station antennas and cellular telephony system frequency bands, this distance can correspond to more than 40 metres, while in urban areas base radio stations are usually positioned at less than 10 metres from inhabited buildings. Consequently, the use of more accurate methods for evaluating electrical field levels in the near-zone of radio-frequency sources, particularly linear array antennas, widely used in cellular telephony systems, is necessary.

A large number of numerical methods and software tools for the evaluation of the electromagnetic field radiated by antennas are currently available. For example, the well-known software NEC-2, described in "Numerical Electromagnetic Code—Method of Moment", by Burk G. J. and Poggio A. J., Lawrence Livermore National Laboratory, January 1981, calculates the electromagnetic field very carefully, both in the far-field and in the near-zone of the transmitting antenna, but requires a good knowledge of wire-grid technique for input file implementation, a precise mechanical quotation of all parts of the antenna and extensive computation time. In practice, however, the knowledge of the antenna is limited to its physical dimensions, its gain and its radiation patterns in the vertical and horizontal planes.

The method for evaluating electrical field levels in the near-zone of transmitting antennas which is the object of the invention overcomes said shortcomings and solves the described technical problems by providing an accurate evaluation while requiring a limited number of input data and reduced processing time by data processing units used for calculating.

Specifically, the object of the invention is a method for evaluating the electrical field levels in the near-zone of transmitting antennas, as described in the characterising part of claim 1.

Figure 2:
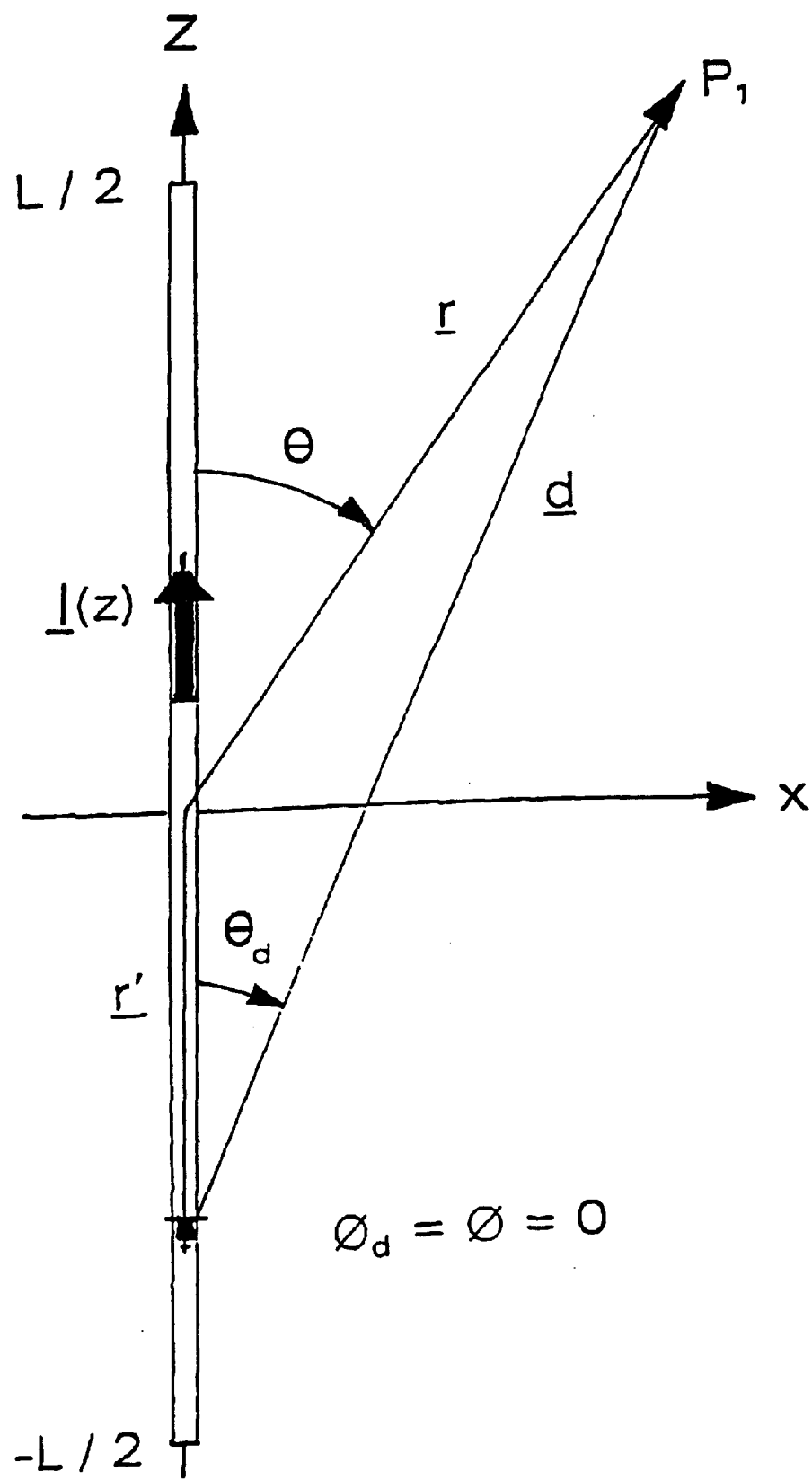

Additional characteristics and advantages of the invention will now be described, by way of example only, with reference to the accompanying drawings wherein:

FIG. 1 schematically shows a linear array antenna arranged along the z axis of a Cartesian reference system in symmetric position with respect to axis x;

FIG. 2 represents a thin wire of arbitrary length L arranged on the z axis of a Cartesian reference systems in symmetric position with respect to axis x.

As previously mentioned, a simple method for estimating the electrical field radiated by a radio base linear array antenna is based on the hypothesis that the antenna gain $G(\theta,\phi)$ can be calculated as the product of radiation patterns in the vertical and horizontal planes. These patterns can be determined by means of measurements made in the first phases of the procedure, along with the physical dimensional measurements on the antenna. Alternatively, the patterns provided by the manufacturer can be used.

According to the method of the invention, the antenna gain $G(\theta,\phi)$ is calculated in a slightly different way by introducing the angle $\Psi$, i.e.:

$$G(\theta,\phi)=G_M D_V(\theta) D_H(\Psi) \qquad (1)$$

where:

$G_M$ is the maximum gain of the antenna $D_V(\theta)$ is the radiation pattern in the vertical plane ($\phi=0$)

$D_H(\Psi)$ is the radiation pattern on a conical surface generated by the rotation on axis z in the maximum radiation direction angle $\Psi$, function of $\theta$, $\phi$ and $\tau$, results from:

$$\psi(\theta, \phi, \tau) = \phi \sin(\beta(\theta, \tau)), \qquad (2)$$

$$\text{where } \beta(\theta, \tau) = \begin{cases} \theta \dfrac{\pi}{\pi + 2\tau} & 0 \le \theta \le \pi/2 + \tau \\ (\pi - \theta)\dfrac{\pi}{\pi - 2\tau} & \pi/2 + \tau < \theta \le \pi \end{cases}$$

where $\tau$ is the down-tilt of the radiation beam with respect to the horizontal plane.

The angle $\Psi$ is introduced to properly match the secondary lobes of the radiation pattern. Its analytical expression derives from setting the following constraints:

The direction $(\theta,\phi)$ does not depend on the angle $\phi$ for $\theta=0$, $\pi$. This is because per $\theta=0$ the direction $(0,\phi)$ is always the direction +z, while for $\theta=\pi$ the direction $(\theta,\phi)$ is always direction −z. Consequently, when $\theta=0,\pi$ the value of $G(\theta,\phi)$ must not depend on the angle $\phi$ and, specifically, must be equal to the value of the vertical pattern on $\theta=0,\pi$: because $D_H(0)=1$, the result is obtained by setting $\Psi=0$;

for $\theta=\pi/2+\tau$, the function $G(\theta,\phi)$ must coincide with the radiation pattern in the horizontal plane. The result is obtained by setting $\Psi=\phi$ because in $\theta=\pi/2+\tau$ the function $D_V(\theta)$ has unitary value.

As known, the electrical field $E(r,\theta,\phi)$ in the far-zone is given by:

$$E(r, \theta, \phi) = \frac{\sqrt{30 P_R G(\theta, \phi)}}{r} \hat{p}(\theta, \phi) \qquad (3)$$

where $P_R$ is the radiated power, r is the distance from the electrical centre of the source and $\hat{p}$ is the polarisation vector.

We will now suppose that the separation of the effects in the vertical plane and in the horizontal plane, as expressed by equation (1), is still valid in the near-zone field, particularly in the zone 2 to 3 $\lambda$ and $$\frac{2L_0^2}{\lambda},$$

where $L_0$ is the maximum extension of the antenna. Because the physical width of a linear array antenna is much smaller than its height, the horizontal pattern contribution $D_H(\Psi)$ to the electrical field in the near-zone field is approximately equal to that in a far-zone field.

According to this hypothesis, the near-zone electrical field can be expressed as:

$$|E(r,\theta,\phi)| = \sqrt{P_{RD_H(\Psi)}} |F(r,\theta)| \qquad (4)$$

where $F(r,\theta)$ is an appropriate vectorial function which is calculated as described below.

Equation 4 can consequently be used to calculate the electrical field in a point $P=(r,\theta,\phi)$ of the space as a product of two contributions: the first of which is due to the electrical field in the horizontal plane of the antenna $D_H(\Psi)$ and the second of which is due to the electrical field in the vertical plane of the antenna $D_V(\theta)$.

The second contribution is obtained by calculating the electrical field in projection $P_1=(r,\theta,0)$ of point $P=(r,\theta,\phi)$ on the vertical plane x, z of the antenna, as shown in FIG. 1. In this figure, the linear array antenna, schematically illustrated, is arranged along the axis z of a Cartesian reference system x, y, z in a symmetric position with respect to axis x. Point P, identified by spherical co-ordinates $r,\theta,\phi$, is the point in space where the electrical field intensity is to be evaluated. Point $P_1$ is the projection of point P on the vertical plane of the antenna (plane x, z) and is obtained by turning point P, around axis z, by an angle which is equal to the value of the spherical co-ordinate $\phi$.

To calculate the electrical field in $P_1$, we introduce the concept of "Equivalent Current Distribution", abbreviated as ECD, i.e. the distribution of current which generates the same radiative effects of a certain source in the near-zone field and in the far-zone field.

In the case of a linear array antenna, which is vertically polarised, the ECD can be conveniently defined as a one-dimensional current along a thin wire of arbitrary length L, as shown along axis z in symmetrical position with respect to axis x in the Cartesian reference system of FIG. 2.

In the figure, I(z) is the electrical current running in the wire, which is supposed polarised in direction z (i.e. $I(z) = I(z)\hat{z}$). Vector r' identifies a generic current element on the thin wire. Co-ordinates d, $\theta_d$, $\phi_d=0$ are the spherical co-ordinates of point $P_1$ in a Cartesian reference system whose origin corresponds to the current element identified by vector r'.

ECD current is obtained from the knowledge of the radiation pattern in the vertical plane of the antenna: from the radiation theory, we can write the radiation pattern in terms of voltage V($\theta$) in the vertical plane x, z as:

$$V(\theta) = \sqrt{D_V(\theta)} = C \sin\theta \int_{-L/2}^{+L/2} I(z) \exp(j 2\pi z \cos\theta) dz \qquad (5)$$

where C is a multiplying constant and I(z) is the current generated in the wire.

By defining:

$u = (\cos\theta)/\lambda$, $\tilde{V}(u) = V(u)/\sqrt{1-(\lambda u)^2}$ and resolving (5) with respect to I(z), i.e. to ECD, we obtain:

$$I(z) = \int_{-L/2}^{+L/2} \tilde{V}(u) \exp(-j 2\pi z u) du = \Im\{\tilde{V}(u)\} \qquad (6)$$

i.e., ECD is the Fourier transform of the previously defined radiation pattern $\tilde{V}(u)$. It can be calculated with a standard Fourier Fast Transform (FFT), by using the Nyquist sampling theorem and estimating the physical extension of the ECD as $\chi$ times the physical height of the antenna. The resulting ECD is consequently discrete, i.e. formed of a certain number of current samples $I_n$. Numeric results demonstrate that $\chi$ values in the range from 2 to 3 are acceptable for linear arrays.

Alternatively, the ECD can be obtained with the Woodward-Lawson sampling method (for example, see article by G. A. Somers "A proof of the Woodward-Lawson sampling method for a finite linear array", Radio Science, Vol. 28, No. 4, pp. 481–485, July–August 1993).

The ECD determined in this way is a discrete current distribution, therefore the vectorial function $F(r,\theta)$, required to compute the electrical field in the vertical plane according to (4), is given by:

$$F(r, \theta) = j \frac{Z_0}{2\lambda} \sum_n \frac{\exp(-jnk_0 d)}{d} I_n \sin\theta_d \hat{\theta}_d \qquad (7)$$

where $Z_0$ is the characteristic impedance of vacuum, equal to 377 $\Omega$, $\lambda$ is the wavelength, $k_0 = 2\pi/\lambda$ is the constant propagation in vacuum, $I_n$ is the nth ECD sample, and d and $\theta_d$, as previously mentioned, are the spherical co-ordinates of point $P_1$ in which to compute the electrical field in the Cartesian reference centred in the nth current sample $I_n$, as shown in FIG. 2.

Naturally, numerous changes can be implemented to the construction and embodiments of the invention herein envisaged without departing from the scope of the present invention, as defined by the following claims.

What is claimed is:

1. Method for evaluating electrical field levels $|E(r,\theta,\phi)|$ in a point $P(r,\theta,\phi)$ in the near-zone of transmitting antennas, particularly linear array antennas located in the origin of a Cartesian reference system identified by the orthogonal co-ordinates (x, y, z) and the spherical co-ordinates $(r,\theta,\phi)$, in which:

the power ($P_R$) of the radio-frequency transmitted by the antenna is established;

the radiation pattern ($D_V$) of the antenna in the vertical plane is determined ($\phi=0$);

the radiation pattern ($D_H$) of the antenna in the horizontal plane is determined;

the physical height of the antenna is measured;

characterised in that said signal power ($P_R$) and said radiation patterns ($D_V$, $D_H$) are used as inputs for data processing means to determine the electrical field level according to the following expression:

$$|E(r,\theta,\phi)| = \sqrt{P_{RD_{H(\Psi)}}}|E(r,\theta)|$$

where: $D_H(\Psi)$ is the radiation pattern on a conical surface generated by the rotation about axis z in the maximum radiation direction; angle $\Psi$, function of $\theta$, $\phi$ and $\tau$, is given by:

$$\psi(\theta, \phi, \tau) = \phi \sin(\beta(\theta, \tau)),$$

where $\beta(\theta, \tau) = \begin{cases} \theta \dfrac{\pi}{\pi + 2\tau} & 0 \le \theta \le \pi/2 + \tau \\ (\pi - \theta)\dfrac{\pi}{\pi - 2\tau} & \pi/2 + \tau < \theta \le \pi \end{cases}$ $\tau$ being the down-tilt of the radiation beam with respect to the horizontal plane (x, y); and $E(r,\theta)$ is a vectorial function resulting from:

$$E(r, \theta) = j\frac{Z_0}{2\lambda} \sum_n \frac{\exp(-jnk_0 d)}{d} I_n \sin\theta_d \hat{\theta}_d$$

where $Z_0$ is the characteristic impedance of vacuum, $\lambda$ is the wavelength, $k_0$ is the propagation constant in vacuum, $I_n$ is the nth sample of one-dimension current (ECD) along a thin wire of arbitrary length (L), which generates the same radiative effects of the antenna both in the near-zone and the far-zone, and d and $\theta_d$ are the spherical co-ordinates of the projection $P_1 = (r,\theta,0)$ of said point $P(r,\theta,\phi)$ in the vertical plane (x, z).

2. Method according to claim 1, characterised in that the following Fourier transform $\Im\{\tilde{V}(u)\}$ is used to determine said one-dimensional current (ECD) by means of data processing means:

where u=

$$I(z) = \int_{-L/2}^{+L/2} \tilde{V}(u) \exp(-j2\pi z u) du = \Im\{\tilde{V}(u)\}$$

$\cos(\theta)/\lambda$ and $\tilde{V}(u)/\sqrt{1-(\lambda u)^2}$, V(u) being the voltage radiation pattern in the vertical plane (x, z), resulting from radiation theory of said radiation pattern ($D_V$).

3. Method according to claim 2, characterised in that said Fourier transform is calculated by said data processing means with a standard Fourier Fast Transform (FFT), by using the Nyquist sampling theorem and estimating the physical extension of said one-dimensional current (ECD) as $\chi$ times said physical height of the antenna, being $\chi$ compressed in the range from 2 to 3.

4. Method according to claim 2, characterised in that said one-dimensional current (ECD) is calculated by data processing means according to Woodward-Lawson sampling method.

* * * * *